(12) United States Patent
Kim

(10) Patent No.: US 8,728,898 B2
(45) Date of Patent: May 20, 2014

(54) METHOD FOR FABRICATING SEMICONDUCTOR DEVICE

(75) Inventor: Su-Young Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 208 days.

(21) Appl. No.: 13/339,747

(22) Filed: Dec. 29, 2011

(65) Prior Publication Data
US 2013/0115748 A1 May 9, 2013

(30) Foreign Application Priority Data
Nov. 4, 2011 (KR) .................. 10-2011-0114393

(51) Int. Cl.
*H01L 21/00* (2006.01)
*H01L 49/02* (2006.01)

(52) U.S. Cl.
CPC .............. *H01L 28/91* (2013.01); *H01L 28/60* (2013.01)
USPC ........... 438/381; 438/386; 438/387; 438/396; 257/E21.024

(58) Field of Classification Search
USPC ................. 438/381, 386, 387, 396, 253; 257/E21.014
See application file for complete search history.

(56) References Cited

U.S. PATENT DOCUMENTS

| 7,449,391 | B2 * | 11/2008 | Manning et al. ............... 438/396 |
| 7,727,837 | B2 * | 6/2010 | Gruening-von Schwerin et al. .............................. 438/253 |
| 2002/0106856 | A1 * | 8/2002 | Lee et al. ....................... 438/255 |
| 2008/0044971 | A1 * | 2/2008 | Kang et al. ..................... 438/253 |
| 2010/0240191 | A1 * | 9/2010 | Chung et al. .................. 438/386 |

FOREIGN PATENT DOCUMENTS

| KR | 10-2009-0005919 | 1/2009 |
| KR | 10-2009-0032880 | 4/2009 |
| KR | 10-2010-0009171 | 1/2010 |
| KR | 10-2011-0028985 | 3/2011 |

* cited by examiner

*Primary Examiner* — Michael Trinh
(74) *Attorney, Agent, or Firm* — IP & T Group LLP

(57) ABSTRACT

A method for fabricating a semiconductor device includes forming a mold layer over a substrate, wherein the mold layer includes a first sacrificial layer and a second sacrificial layer that are stacked, forming an insulation layer pattern that has an etch selectivity to the first sacrificial layer and the second sacrificial layer on the mold layer, etching the mold layer using the insulation layer pattern as an etch barrier to form storage node holes, forming a storage node conductive layer over a substrate structure including the insulation layer pattern and the mold layer that has been etched, performing a storage node isolation process that simultaneously forms storage nodes and forming the insulation layer pattern to a first thickness, and removing the first sacrificial layer and the second sacrificial layer.

14 Claims, 5 Drawing Sheets

METHOD FOR FABRICATING SEMICONDUCTOR DEVICE

CROSS-REFERENCE TO RELATED APPLICATIONS

The present application claims priority of Korean Patent Application No. 10-2011-0114393, filed on Nov. 4, 2011, which is incorporated herein by reference in its entirety.

BACKGROUND

1. Field

Exemplary embodiments of the present invention relate to semiconductor device fabrication technology, and more particularly, to a method for fabricating a semiconductor device including a storage node support layer.

2. Description of the Related Art

As semiconductor memory devices are highly integrated, the area of a memory cell decreases. To realize reliable operation characteristics in the decreasing memory cell area, a capacitor that may secure a capacitance for each memory cell is useful. More specifically, storage nodes (SN) are formed in a cylindrical shape and the heights of the cylindrical storage nodes are increased.

As the height of the storage nodes is increased within a limited area to secure capacitance, the storage nodes may lean. To protect the storage nodes from leaning, a method of forming a support layer connecting storage nodes to each other is introduced. A capacitor using a nitride layer as the support layer is referred to as a nitride floating capacitor (NFC).

FIGS. 1A to 1D are cross-sectional views illustrating a conventional method for fabricating a semiconductor device.

Referring to FIG. 1A, a mold layer 100 is formed over a substrate 11 including a structure, such as a storage node contact plug (SNC). Here, the mold layer 100 includes an etch stop layer 12, a first insulation layer 13, a support layer 14, and a second insulation layer 15 for preventing the support layer 14 from being lost between processes. The etch stop layer 12 and the support layer 14 are formed of a nitride layer, and the first insulation layer 13 and the second insulation layer 15 are formed of an oxide layer. The mold layer 100 is formed to have a height H higher than the height of a storage node to be formed.

Subsequently, a hard mask pattern 16 is formed over the mold layer 100.

Referring to FIG. 1B, storage node holes 17 are formed by using the hard mask pattern 16 as an etch barrier and etching the mold layer 100 until the substrate 11 is exposed.

Referring to FIG. 1C, after the hard mask pattern 16 is removed, a storage node conductive layer is formed along the surface of the structure including the storage node holes 17.

Subsequently, cylindrical storage nodes 18 are formed in the storage node holes 17 by performing a storage node isolation process.

Referring to FIG. 1D, the first insulation layer 13 and the second insulation layer 15 are removed by performing a dip-out process. As shown in FIG. 1D, the support layer 14 that remains after the dip-out process may protect the storage nodes 18 from leaning.

Subsequently, although not illustrated in the drawing, a capacitor is formed by sequentially forming a dielectric layer and a plate.

In the semiconductor device fabricated according to the conventional method, the support layer 14 protects the cylindrical storage nodes 18 from leaning during the dip-out process. At the same time, when the storage node holes 17 are formed, the support layer 14 prevents a bowing profile from being formed on the sidewalls of the cylindrical storage nodes 18.

More specifically, since the height of the storage node holes 17 are increased to increase the height of the storage nodes 18 within a limited area, the aspect ratio of the storage node holes 17 is increased. As the aspect ratio of the storage node holes 17 is increased, a bowing profile may be formed on the sidewalls of the upper regions (refer to a reference symbol 'A' of FIG. 1B) of the storage node holes 17. Since the support layer 14 that is formed of a nitride layer that has a denser layer quality than the first insulation layer 13 and the second insulation layer 15, a bowing profile may be prevented from being formed in a region where the support layer 14 is formed. Therefore, as the support layer 14 becomes thicker, a bowing profile may be prevented from being formed on the sidewalls of the storage node holes 17.

However, when the support layer 14 becomes thicker to prevent the formation of bowing profile, the total height H of the mold layer 100 is increased. Thus, the burden of performing the etch process that forms the storage node holes 17 is increased. The increased burden for forming the storage node holes 17 may causes issues or flaws. One such issue is called 'Not Open', which means that the substrate 11 may not be exposed by the etching process that forms the storage node holes 17.

Also, when the support layer 14 is thick, storage nodes may lean due to the thick support layer 14. Therefore, since a portion of the support layer 14 is to be etched during the storage node isolation process in order to control the thickness of the support layer 14, the burden of performing an etch process during the storage node isolation process is increased.

SUMMARY

An embodiment of the present invention is directed to a method for fabricating a semiconductor device that may prevent a bowing profile from being formed on a sidewall of storage node holes in a semiconductor device including a storage node support layer.

In accordance with an embodiment of the present invention, a method for fabricating a semiconductor device includes: forming a mold layer over a substrate, wherein the mold layer includes a first sacrificial layer and a second sacrificial layer that are stacked; forming an insulation layer pattern that has an etch selectivity to the first sacrificial layer and the second sacrificial layer on the mold layer; etching the mold layer using the insulation layer pattern as an etch barrier to form storage node holes; forming a storage node conductive layer over a substrate structure including the insulation layer pattern and the mold layer that has been etched; performing a storage node isolation process that simultaneously forms storage nodes and forming the insulation layer pattern to a first thickness; and removing the first sacrificial layer and the second sacrificial layer.

In accordance with another embodiment of the present invention, a method for fabricating a semiconductor device includes: forming a mold layer, wherein the mold layer includes a first sacrificial layer and a second sacrificial layer that are stacked; forming a conductive layer pattern that has an etch selectivity to the first sacrificial layer and the second sacrificial layer on the mold layer; etching the mold layer using the conductive layer pattern as an etch barrier to form storage node holes; forming a storage node conductive layer over a substrate structure including the conductive layer pattern and the mold layer that has been etched; performing a storage node isolation process that simultaneously forms storage nodes and forming the conductive layer pattern to a first thickness; removing the first sacrificial layer and the second sacrificial layer; and performing a post-process to transform the conductive layer pattern into an insulation layer pattern.

In accordance with yet another embodiment of the present invention, a method for fabricating a semiconductor device includes: forming a mold layer, wherein the mold layer includes an oxide layer and a nitride layer that are stacked; forming a polysilicon layer pattern on the mold layer; etching the mold layer using the polysilicon layer pattern as an etch barrier to form storage node holes; forming a storage node conductive layer over a substrate structure including the polysilicon layer pattern and the mold layer that has been etched; performing a storage node isolation process that simultaneously forms storage nodes and forming the polysilicon layer pattern to a first thickness; removing the nitride layer and the oxide layer by performing a dip-out process; and performing a post-process to transform the polysilicon layer pattern into a silicon insulation layer pattern.

DETAILED DESCRIPTION

Figure 1A:
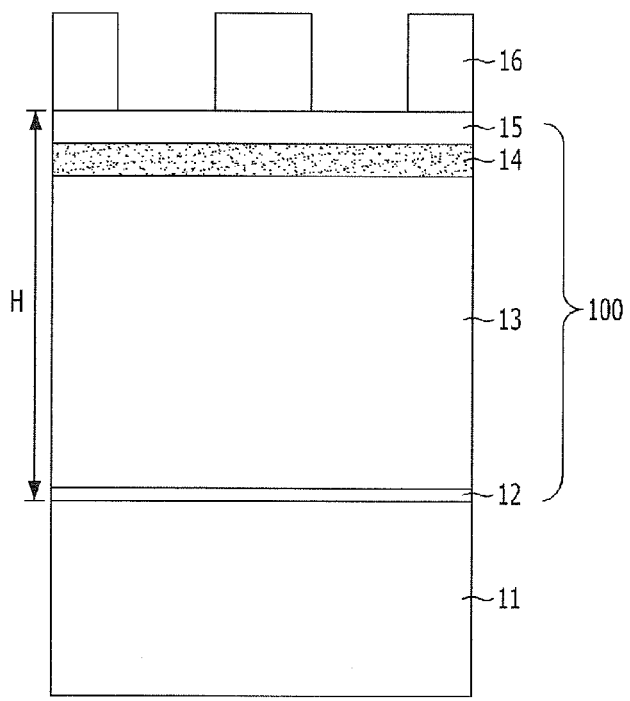
FIGS. 1A to 1D are cross-sectional views illustrating a conventional method for fabricating a semiconductor device.
Figure 1B:
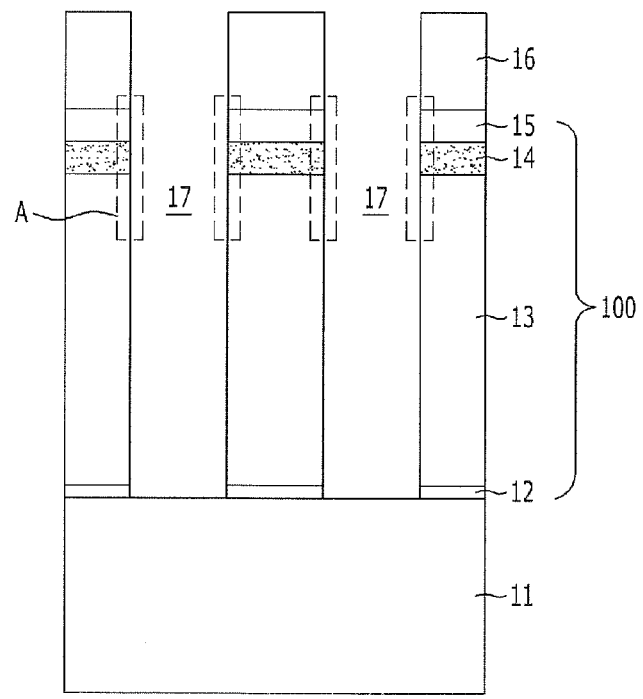
Figure 1C:
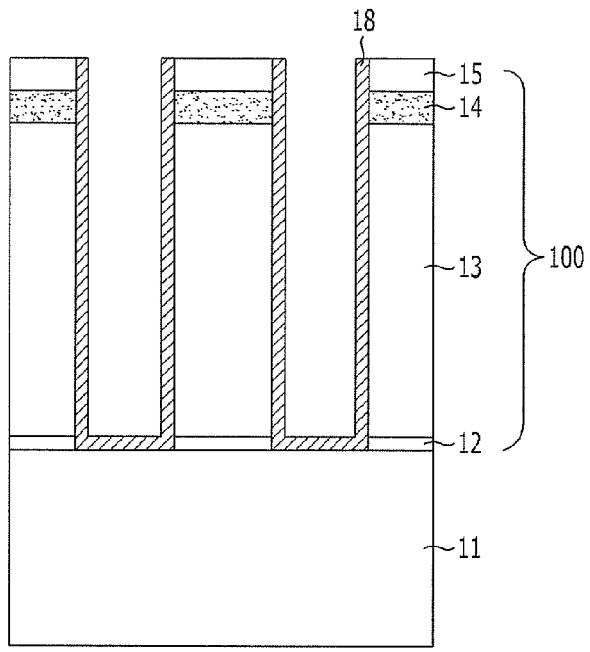
Figure 1D:
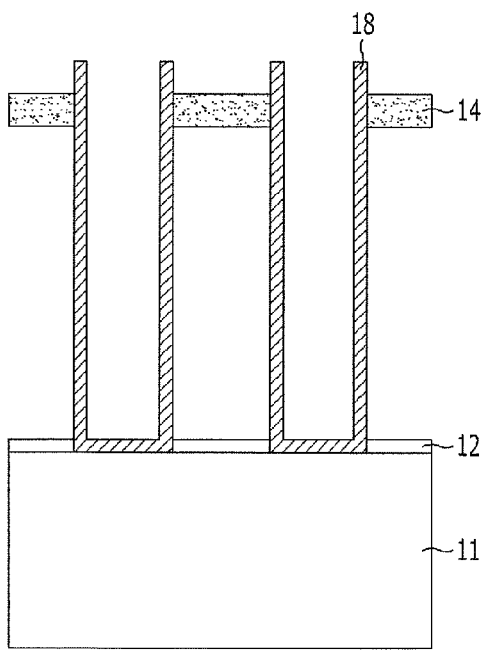

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2F are cross-sectional views illustrating a method for fabricating a semiconductor device in accordance with an embodiment of the present invention.

Figure 2A:
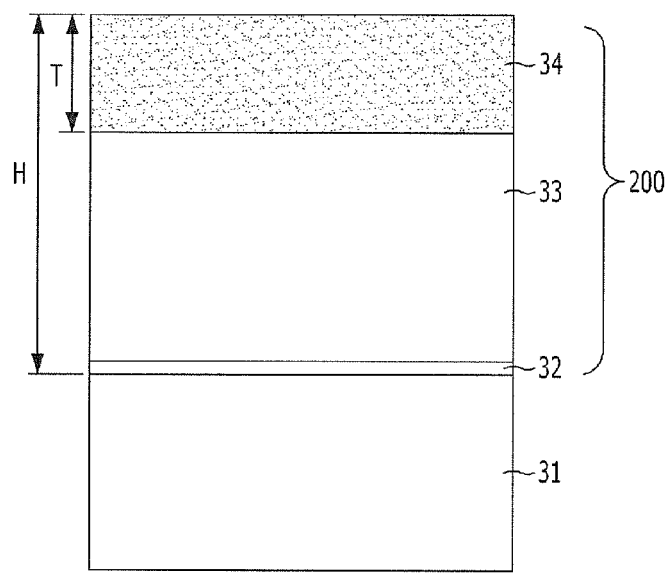
FIGS. 2A to 2F are cross-sectional views illustrating a method for fabricating a semiconductor device in accordance with an embodiment of the present invention.

Referring to FIG. 2A, a mold layer 200 is formed over a substrate 31 that includes a structure, such as storage node contact plugs (SNC). Here, the mold layer 200 includes an etch stop layer 32, a first sacrificial layer 33, and a second sacrificial layer 34 that are sequentially stacked. Here, the second sacrificial layer 34 may prevent a bowing profile from being formed on a sidewall of the upper regions of storage node holes through a subsequent process. Therefore, the second sacrificial layer 34 may be formed of a material layer having a denser layer quality than the first sacrificial layer 33.

The etch stop layer 32, the first sacrificial layer 33, and the second sacrificial layer 34 may be formed of any one material selected from the group consisting of an oxide layer, a nitride layer, and an oxynitride layer. For example, the etch stop layer 32 and the second sacrificial layer 34 may be formed of a nitride layer, and the first sacrificial layer 33 may be formed of an oxide layer.

The second sacrificial layer 34 is formed to have a thickness T that may cover a region where a bowing profile may be formed during the process of forming storage node holes.

Figure 2B:
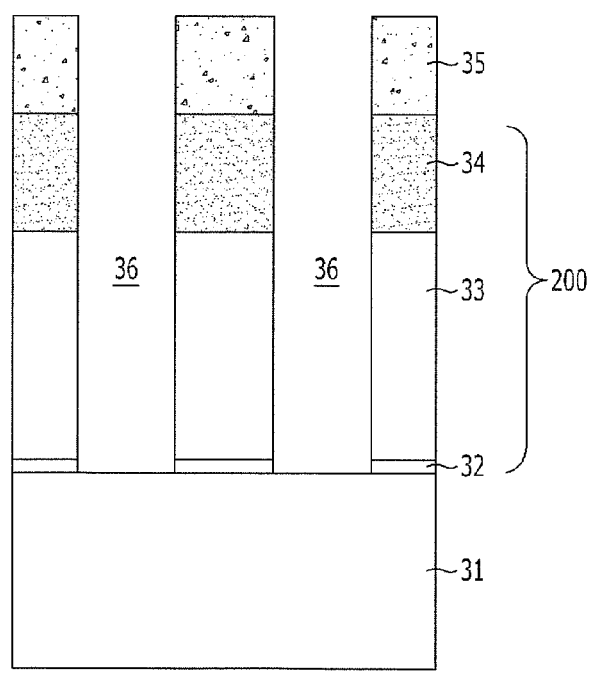

Referring to FIG. 2B, a hard mask pattern 35 is formed over the mold layer 200. The hard mask pattern 35 serves as an etch barrier during the process of forming storage node holes, and at the same time, the hard mask pattern 35 serves as a support layer that prevents storage nodes from leaning during a subsequent dip-out process. Therefore, the hard mask pattern 35 is formed of a material that has an etch selectivity to the mold layer 200 and is capable of insulating the storage nodes from each other. For example, the hard mask pattern 35 may be formed of a polysilicon layer. Of course, the hard mask pattern 35 may be formed of all kinds of material layers having an etch selectivity to the mold layer 200 and capable of insulating the storage nodes from each other. Storage node holes 36 that expose the substrate 31 are formed by using the hard mask pattern 35 as an etch barrier and etching the mold layer 200. Here, the second sacrificial layer 34 having a denser layer quality than the first sacrificial layer 33 may prevent a bowing profile from being formed on the sidewalls of the storage node holes 36.

Also, since the first sacrificial layer 33 and the second sacrificial layer 34 are removed during the subsequent dip-out process, the total height H of the mold layer 200 is not increased although the second sacrificial layer 34 is formed to a thickness T to cover a region where a bowing profile may be formed. Therefore, since the load from performing an etch process that forms the storage node holes 36 is not increased, such flaws as 'Not Open' may be prevented.

Meanwhile, when the storage node holes 36 are formed, a portion of the hard mask pattern 35 may be etched and the height of the hard mask pattern 35 may decrease.

Figure 2C:
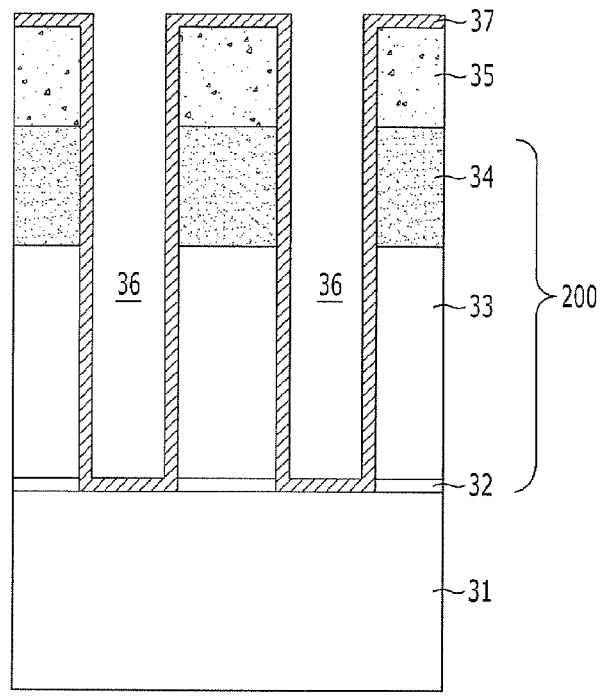

Referring to FIG. 2C, a storage node conductive layer 37 is formed over the substrate structure including the hard mask pattern 35. For example, the storage node conductive layer 37 may be formed over the surface of the substrate structure including the storage node holes 36. The storage node conductive layer 37 may be formed of a stacked layer including a metal layer and a metal oxide layer. For example, the storage node conductive layer 37 may be formed of a stacked layer including a titanium layer and a titanium nitride layer.

Additionally, when the storage node conductive layer 37 is formed over the surface of the substrate structure including the storage node holes 36, cylindrical storage nodes may be formed. When the storage node conductive layer 37 is formed to fill the storage node holes 36, pillar-type storage nodes may be formed.

Figure 2D:
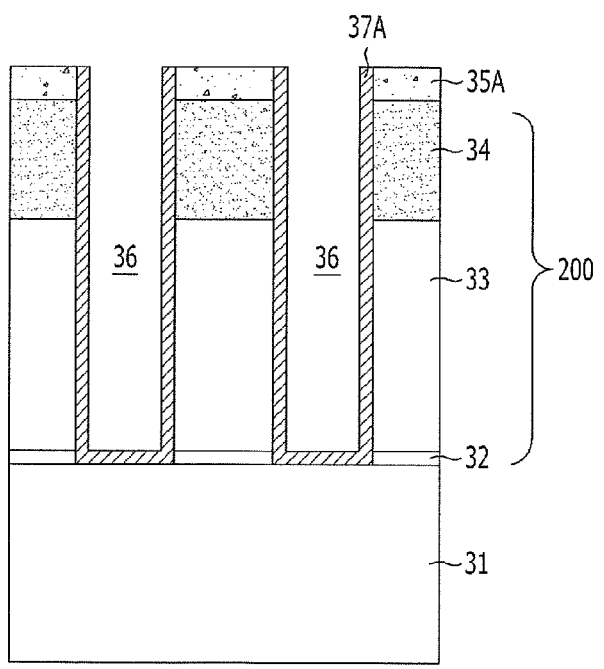

Referring to FIG. 2D, cylindrical storage nodes 37A are formed in the storage node holes 36 by performing a storage node isolation process. As shown in FIG. 2D, a portion of the hard mask pattern 35 that remains after the storage node isolation process is completed functions as a support layer. The storage node isolation process may be carried out through a Chemical Mechanical Polishing (CMP) process or a blanket etch process, e.g., an etch-back process.

Since a portion of the hard mask pattern 35 remains after the storage node isolation process is completed, the height of the storage nodes may be increased as high as the height of the remaining hard mask pattern 35. By increasing the height of the storage nodes to the height of the remaining hard mask pattern 35, the height H of the mold layer 200 may be decreased by the height of the remaining hard mask pattern 35. Therefore, the load from performing an etch process that forms the storage node holes 36 may be decreased.

Additionally, when the thickness of the remaining hard mask pattern 35 after the formation of the storage node holes 36 is thicker than the thickness of the support layer required by the semiconductor device, a portion of the hard mask pattern 35 may be etched during the storage node isolation process in order to control the thickness of the remaining hard mask pattern 35. Hereafter, the hard mask pattern 35 that has a decreased thickness is referred to as a thin hard mask pattern 35A.

Subsequently, although not illustrated in the drawing, the thin hard mask pattern 35A is selectively etched. This etching is to process the shape of the thin hard mask pattern 35A in such a manner that the thin hard mask pattern 35A may function as a support layer. For example, the thin hard mask pattern 35A may have a shape that connects two adjacent storage nodes 37A, a shape that connects four adjacent storage nodes 37A, and a line shape that connects the storage nodes 37A that are arrayed in any one direction.

Figure 2E:
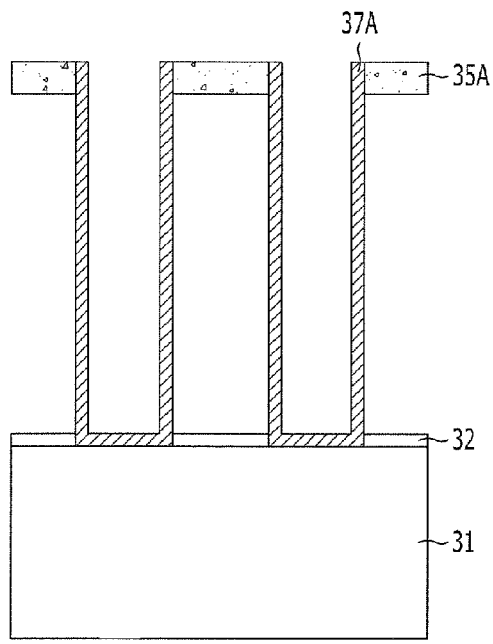

Referring to FIG. 2E, the first sacrificial layer 33 and the second sacrificial layer 34 are removed by performing a dip-out process. Since the thin hard mask pattern 35A is formed of a material having an etch selectivity to the first sacrificial layer 33 and the second sacrificial layer 34, the thin hard mask patter 35A is not removed during the dip-out process, and the thin hard mask pattern 35A functions as a support layer to prevent the storage nodes 37A from leaning during the dip-out process.

When the first sacrificial layer 33 is formed of an oxide layer and the etch stop layer 32 and the second sacrificial layer 34 are formed of a nitride layer, the dip-out process may be carried out by removing the second sacrificial layer 34 by using a phosphoric acid solution and subsequently removing the first sacrificial layer 33.

Additionally, when the thin hard mask pattern 35A is formed of an insulation material having an etch selectivity to the first sacrificial layer 33 and the second sacrificial layer 34, a capacitor is formed by sequentially forming a dielectric layer and a plate after the dip-out process. However, when the thin hard mask pattern 35A is formed of a conductive material, such as polysilicon, a short occurs between adjacent storage nodes 37A because the thin hard mask pattern 35A that functions as a support layer is formed of a conductive material. To address the short, a post-process for preventing a short from occurring between the storage nodes 37A is performed. Hereafter, the post-process is described in detail with reference to FIG. 2F.

Figure 2F:
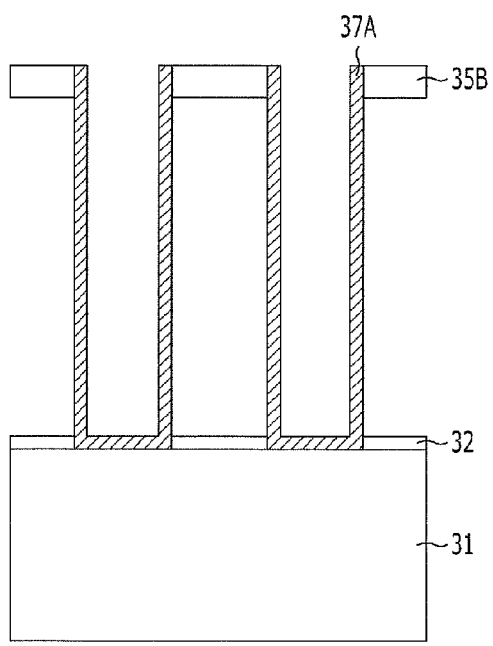

Referring to FIG. 2F, when the thin hard mask pattern 35A is formed of a conductive material, the post-process is performed to give the thin hard mask pattern 35A insulation characteristics. More specifically, the post-process transforms the conductive material of the thin hard mask pattern 35A into an insulation material. Hereafter, the post-processed thin hard mask pattern 35A is referred to as a post-processed thin hard mask pattern 35B.

The post-process may be performed using any method selected from the group consisting of oxidation, nitration, and oxynitrocarburising. Each of the oxidation, nitration, and oxynitrocarburising may be performed using one or more methods selected from the group consisting of thermal treatment, plasma treatment, and radical treatment. For example, the post-process may be performed through any method among thermal treatment, plasma treatment, and radical treatment; or the post-process may be performed by simultaneously performing thermal treatment and plasma treatment. As an example, the thin hard mask pattern 35A is polysilicon and the post-process is performed through an oxidation method. Hereafter, this example will be described.

The post-process using the oxidation method may be performed through one or more methods selected from the group consisting of a method of performing a thermal treatment in the atmosphere of a gas containing oxygen, a method of performing a plasma treatment using active oxygen ions generated from using a gas containing oxygen, and a method of performing a plasma treatment using oxygen radicals generated from using a gas containing oxygen. When the post-process is performed onto the thin hard mask pattern 35A formed of polysilicon through the oxidation method, the thin hard mask pattern 35A formed of polysilicon is transformed into the post-processed thin hard mask pattern 35B formed of a silicon oxide layer as the thin hard mask pattern 35A is oxidized. Herein, when the post-process is performed through the nitration method or the oxynitrocarburising method, the thin hard mask pattern 35A formed of polysilicon is transformed into the post-processed thin hard mask pattern 35B formed of a silicon nitride layer or the post-processed thin hard mask pattern 35B formed of a silicon oxynitride layer, respectively.

Subsequently, although not illustrated in the drawing, the formation of the capacitor is completed by sequentially forming a dielectric layer and a plate.

According to the embodiment of the present invention described above, a bowing profile may be prevented from being formed on the sidewalls of the storage node holes 36 by forming the second sacrificial layer 34. Also, since the second sacrificial layer 34 is removed during the dip-out process, the total height H of the mold layer 200 is not increased, thus reducing the load of performing an etch process for forming the storage node holes 36.

Also, according to the embodiment of the present invention described above, the storage nodes 37A may be protected from leaning because the remaining thin hard mask pattern 35A functions as a support layer during the dip-out process. Also, since the semiconductor device fabrication process according to the embodiment of the present invention does not require an additional process for forming a support layer, the process may be simplified.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a mold layer, wherein the mold layer includes a first sacrificial layer and a second sacrificial layer that are stacked;
   forming a conductive layer pattern that has an etch selectivity to the first sacrificial layer and the second sacrificial layer on the mold layer;
   etching the mold layer using the conductive layer pattern as an etch barrier to form storage node holes;
   forming a storage node conductive layer over a substrate structure including the conductive layer pattern and the mold layer that has been etched;
   performing a storage node isolation process that simultaneously forms storage nodes and forming the conductive layer pattern to a first thickness;
   removing the first sacrificial layer and the second sacrificial layer; and
   performing a post-process to transform the conductive layer pattern into an insulation layer pattern.

2. The method of claim 1, wherein the second sacrificial layer is formed of a material having a denser layer quality than a material of the first sacrificial layer.

3. The method of claim 1, wherein the second sacrificial layer is formed to have a thickness that covers a region where a bowing profile is formed in the storage node holes.

4. The method of claim 1, wherein the storage node isolation process is performed through a Chemical Mechanical Polishing (CMP) or a blanket etch process.

5. The method of claim 1, wherein the storage nodes have a cylindrical shape or a pillar shape.

6. The method of claim 1, wherein the performing of the post-process is performed through one method selected from the group consisting of oxidation, nitration, and oxynitrocarburising.

7. The method of claim 6, wherein the performing of the post-process is performed through at least one method selected from the group consisting of thermal treatment, plasma treatment, and radical treatment.

8. A method for fabricating a semiconductor device, comprising:
    forming a mold layer, wherein the mold layer includes an oxide layer and a nitride layer that are stacked;
    forming a polysilicon layer pattern on the mold layer;
    etching the mold layer using the polysilicon layer pattern as an etch barrier to form storage node holes;
    forming a storage node conductive layer over a substrate structure including the polysilicon layer pattern and the mold layer that has been etched;
    performing a storage node isolation process that simultaneously forms storage nodes and forming the polysilicon layer pattern to a first thickness;
    removing the nitride layer and the oxide layer by performing a dip-out process; and
    performing a post-process to transform the polysilicon layer pattern into a silicon insulation layer pattern.

9. The method of claim 8, wherein the nitride layer is formed to have a thickness that covers a region where a bowing profile is formed in the storage node holes.

10. The method of claim 8, wherein the storage node isolation process is performed through a Chemical Mechanical Polishing (CMP) or a blanket etch process.

11. The method of claim 8, wherein the performing of the post-process is performed through one method selected from the group consisting of oxidation, nitration, and oxynitrocarburising.

12. The method of claim 11, wherein the performing of the post-process is performed through at least one method selected from the group consisting of thermal treatment, plasma treatment, and radical treatment.

13. The method of claim 8, wherein the polysilicon layer pattern supports the storage nodes during the dip-out process.

14. The method of claim 8, further comprising:
    etching the polysilicon layer pattern to connect the polysilicon layer pattern to two adjacent storage nodes, four adjacent storage nodes, or to the storage nodes arrayed in any one direction.

* * * * *